United States Patent
Akage et al.

(10) Patent No.: US 7,535,101 B2
(45) Date of Patent: May 19, 2009

(54) ELECTRODE PAD ON CONDUCTIVE SEMICONDUCTOR SUBSTRATE

(75) Inventors: Yuichi Akage, Isehara (JP); Hideki Fukano, Isehara (JP); Takayuki Yamanaka, Isehara (JP); Tadashi Saitoh, Suita (JP)

(73) Assignee: Nippon Telegraph and Telephone Corporation, Tokyo (JP)

( * ) Notice: Subject to any disclaimer, the term of this patent is extended or adjusted under 35 U.S.C. 154(b) by 227 days.

(21) Appl. No.: 10/576,627

(22) PCT Filed: May 18, 2005

(86) PCT No.: PCT/JP2005/009064

§ 371 (c)(1),
(2), (4) Date: Mar. 14, 2007

(87) PCT Pub. No.: WO2005/112096

PCT Pub. Date: Nov. 24, 2005

(65) Prior Publication Data

US 2007/0290360 A1 Dec. 20, 2007

(30) Foreign Application Priority Data

May 18, 2004 (JP) .............................. 2004-147294

(51) Int. Cl.
*H01L 23/48* (2006.01)
(52) U.S. Cl. ...................................... 257/737; 257/778
(58) Field of Classification Search .................. 257/737, 257/738, 773, 778
See application file for complete search history.

(56) References Cited

U.S. PATENT DOCUMENTS 6,914,333 B2 * 7/2005 Lo et al. ...................... 257/737

FOREIGN PATENT DOCUMENTS

| JP | 06-013438 | 1/1994 |
| JP | 2003-023010 | 1/2003 |

OTHER PUBLICATIONS

M.N. Khan et al., *Theoretical Prediction and Experimental Verification of Quantum Well Electroabsorption Modulators with Bandwidths Exceeding 40 GHz*, OFC99, paper ThT4-1/293.

* cited by examiner

*Primary Examiner*—Roy K Potter
(74) *Attorney, Agent, or Firm*—Workman Nydegger

(57) ABSTRACT

An electrode pad on a semiconductor substrate having a reduced capacitance of an electrode pad portion and allowing control of a characteristic impedance for a practical electrode pad size is provided. A mesa-stripe type optical waveguide formed by stacking an n-InP clad layer 2, an i layer 3 and a p-InP clad layer and p type contact layer 4 is formed on an n-InP substrate 1, an insulating material film 8 having a mesa-shaped deposited portion 8c near the optical waveguide is formed on the n-InP substrate 1, an electrode 11a and wiring electrodes 11b and 11c for supplying an electrical signal to the optical waveguide are placed on the optical waveguide and the insulating material film 8, respectively, and an electrode pad 10 is placed on the top surface of the mesa-shaped deposited portion 8c, so that the n-InP substrate 1 and the electrode pad 10 have a predetermined interval $t_1$ (about 17 to 29 μm)

20 Claims, 14 Drawing Sheets

STEP (1)
STEP (2)
STEP (3)
STEP (4)

STEP (5)

STEP (6)

STEP (7)

STEP (8)

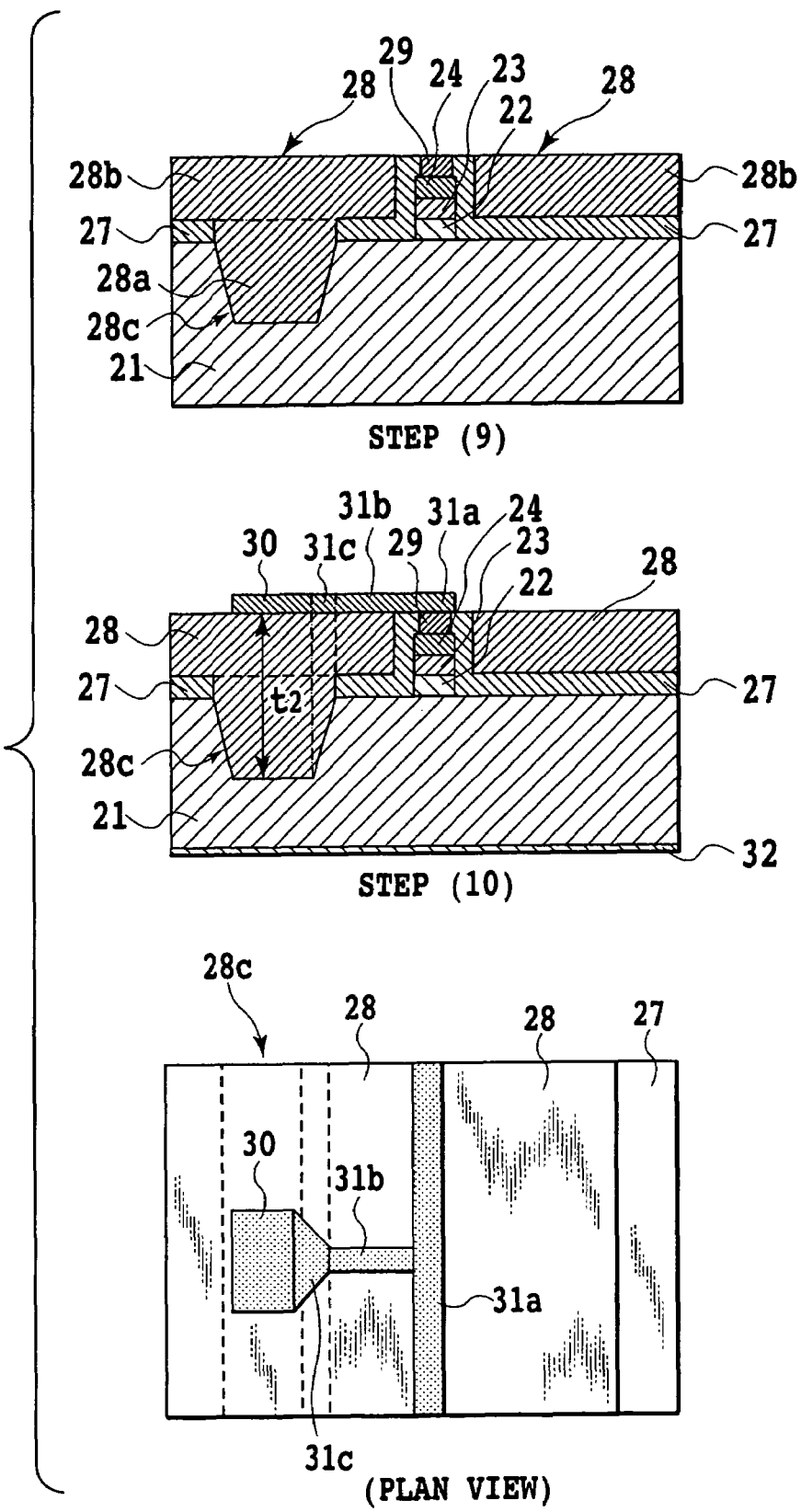

ELECTRODE PAD ON CONDUCTIVE SEMICONDUCTOR SUBSTRATE

TECHNICAL FIELD

The present invention relates to an electrode pad of an electronic device and an optical device fabricated on a conductive semiconductor substrate.

BACKGROUND ART

FIGS. 13A, 13B and 13C are schematic block diagrams of one example of a conventional electrode pad. An electronic device or optical device fabricated on a semiconductor substrate is usually provided with electrode pads 123 and 124 shown in FIG. 13A.

The electrode pads 123 and 124 are formed on substrates 121 and 122, respectively, and play an important role of supplying from outside an electrical signal for driving the electronic device or optical device and taking to outside an electrical signal amplified or detected by the electronic device or optical device by electrically establishing connection between the electrode pads by a connection wiring 125 such as an metal wire.

If an electrical signal is supplied from outside or an electrical signal is taken out to outside as described above, it is necessary to electrically connect an external electrical device, a wiring track, a connector and the like to the electronic device or optical device by the connecting wire 125. The electrode pad is absolutely necessary for improving workability in the electrical connection or preventing the electronic device or optical device from being impacted in a bonding wire.

Thus, when the electronic device or optical device is designed, the electrode pad should meet the following requirements: (1) it should be capable of being wired reliably in an operation of connection to an external component by bonding wire; (2) it should have a good property of adhesion to the semiconductor substrate 121; (3) it should have a good property of adhesion to an $SiO_2$ film or a low-permittivity insulating material film 126 formed on the semiconductor substrate 121 for preventing short circuit between the substrate and electrode pad when electrode pads are formed on a conductive semiconductor substrate (FIG. 13C); (4) it should be situated such that the function of the electronic device or optical device is not impaired by an impact given in the wiring operation; and (5) the function of the electronic device or optical device should not be limited by the resistance of the electrode pad, a parasitic capacitance or the like. Generally, the electrode pad is designed with consideration given to these requirements (see Non-Patent Document 1 described below).

Non-Patent Document 1: M. N. Khan, et al., "Theoretical prediction and experimental verification of quantum well electroabsorption modulators with bandwidths exceeding 40 GHz", OFC99, paper ThT4-1/293.

DISCLOSURE OF THE INVENTION

Generally, if the semiconductor substrate for use in the electronic device or optical device is a conductive semiconductor substrate, a capacitance tends to arise between the semiconductor substrate and an electrode, which is including pad portion, opposite to the semiconductor substrate, and a characteristic impedance control in the electrode portion becomes difficult.

Since it is necessary to increase the area of the electrode pad portion, an electronic device having complicated electrode wiring is generally fabricated on a semi-insulating substrate in which it is easy to control the characteristic impedance to achieve efficient transmission of an electrical signal.

The optical device is often fabricated on a conductive semiconductor substrate because the electrode on the substrate side (electrode electrically connected to the substrate) is easily fabricated, it is hardly required to complicatedly draw the electrode, so that the effect of the electrode capacitance is insignificant, and so on.

However, with enhancement of the speed of the operation of the electronic device and the optical device in recent years, the requirement to integrate the electronic device and the optical device on the same substrate, to construct the electrode and the pad on a chip such that the device characteristic of each device is not influenced by the wiring electrode between an electronic device chip and an optical device chip, and to control the characteristic impedances of the electrode including the pad portion, and to manage the characteristic of a bonding wire has increased.

FIG. 14 is schematic structure diagram of an electrode pad on a conventional semiconductor optical device. This figure shows the conventional semiconductor optical device fabricated on the conductive semiconductor substrate, and the electrode provided therein.

As shown in this figure, a mesa-stripe type optical waveguide formed by stacking a semiconductor clad layer 102 having a first conductivity, an active layer, optical absorption layer or optical waveguide core layer 103 of the optical device, and a semiconductor clad layer and semiconductor contact layer 104 having a second conductivity is formed on a semiconductor substrate 101 having a first conductivity.

An electrode pad 112 is formed on the undersurface of the semiconductor substrate 101, and electrical connection to the optical waveguide from the semiconductor clad layer 102 side is established. Electrical connection to the optical waveguide from the side of the semiconductor clad layer and semiconductor contact layer 104 having the second conductivity is established by an electrode pad 110 provided opposite to the semiconductor substrate 101 and a wiring electrode 111b between the electrode pad 110 and an electrode metal 111a on the semiconductor layer 104 having the second conductivity.

The electrode pad 110 (and the wiring electrode 111b) is placed on the semiconductor substrate 101 via a low-permittivity insulating material film 108 having a thickness of $t_0$ for preventing short-circuit with the conductive substrate 101. If characteristic impedance control of the electrode pad 110 opposite to the semiconductor substrate 101 is performed, the thickness $t_0$ of the low-permittivity insulating material film 108 is an important parameter.

However, in the electronic device and the optical device, a design for reducing projections and depressions of the substrate has been commonly made. This is on the ground that ease of a fabrication process is ensured because for a substrate having heavy projections and depressions, photolithography cannot be performed with high accuracy, it is difficult to make a high mesa in dry etching, or an electrode process in a mesa having large steps is difficult. Therefore, even in an optical device having relatively heavy projections and depressions, a gap $t_0$ between the conductive semiconductor substrate and the electrode pad is equivalent to no more than the height of the mesa of the optical waveguide (e.g. $t_0 \leq 5$ μm)

Since the gap between the conductive semiconductor substrate and the electrode pad is thus small, there is a problem such that a capacitance arising in the electrode pad portion opposite to the semiconductor substrate becomes so high that characteristic impedance control of the electrode pad portion becomes difficult. Moreover, there is a problem such that if an electrode pad having a characteristic impedance of 50 ohms which is generally considered suitable is designed, the width of the electrode pad is no more than 10 µm, and thus bonding to an external wiring substrate or the like by a metal wire is impossible from a practical viewpoint.

The present invention has been made in view of the above-mentioned situations, and its object is to provide an electrode pad on a semiconductor substrate having a reduced capacitance of an electrode pad portion and allowing control of a characteristic impedance for a practical electrode pad size.

For achieving the object described above, an electrode pad on a conductive semiconductor substrate according to the present invention comprises a conductive substrate, an insulating material film formed on the conductive substrate, an electrode pad formed on the insulating material film; and a wiring electrode formed on the insulating material film, connected to the electrode pad, and having a width different from that of the electrode pad, wherein the size of the electrode pad is substantially equal to or greater than the size of a part of electrical connection to an external device, and a first thickness of a first region of the insulating material film on which at least the electrode pad is formed is different from a second thickness of a second region of the insulating material film on which at least part of the wiring electrode is formed and which is a region other than the first region so that a characteristic impedance of the electrode pad is almost matching with a characteristic impedance of the external device connected to the electrode pad.

The "size" of the electrode pad means the size of a one side if the electrode pad is a square planar electrode pad, for example, and means the size of a diameter if the electrode pad is a circular planar electrode pad, for example. In addition, there are electrodes of various shapes, but the "size" generally means the outer dimension of the electrode pad. The part of electrical connection to outside is a metal wire or metal ribbon for bonding, or a solder bump or the like in flip chip bonding.

In the electrode pad on the conductive semiconductor substrate, the width of the wiring electrode maybe smaller than the size of the electrode pad, and the thickness of the first region of the insulating material film is grater than the thickness of the second region of the insulating material film.

By separating the electrode pad and the semiconductor substrate much away from each other with a low-permittivity insulating material film provided between the electrode pad and the conductive semiconductor substrate, the capacitance of the electrode pad can be reduced compared with the conventional technique, and matching to the characteristic impedance of the external device connected to the electrode pad becomes possible.

In the electrode pad on the conductive semiconductor substrate, the insulating material film may have a protruding portion in which the first region protrudes to the surface side.

In the electrode pad on the conductive semiconductor substrate, a side wall surface of the protruding portion may be inclined.

In the electrode pad on the conductive semiconductor substrate, the electrode pad may be positioned on the upper surface of the protruding portion, and the wiring electrode placed along the surface of the insulating material film may be connected to the electrode pad, and a electrode portion placed on the inclined side wall surface has a plane taper shape in which the width increases as the thickness up to the semiconductor substrate below the wiring electrode increases.

In the electrode pad on the conductive semiconductor substrate, a trench portion maybe formed on the conductive substrate, and a part of the first region of the insulating material film may be formed in the trench portion so that an interval between the bottom surface of the trench portion and the electrode pad equals the first thickness.

In the electrode pad on the conductive semiconductor substrate, a surface of the insulating material film may be substantially flat.

By forming a trench on the conductive semiconductor substrate and embedding an insulating material in the trench, the surface on which the electrode pad is placed can be flattened even if the thickness of the insulating material directly below the electrode pad is increased.

In the electrode pad on the conductive semiconductor substrate, the side wall surface of the trench portion may be inclined to the extent that an angle formed with the bottom surface of the trench portion is greater than the right angle.

In the electrode pad on the conductive semiconductor substrate, the electrode pad may be positioned above the bottom surface of the trench portion, and the wiring electrode placed along the surface of the insulating material film may be connected to the electrode pad, and a portion positioned above the inclined side wall surface in the wiring electrode has a plane taper shape in which the width increases as the depth to the semiconductor substrate below the wiring electrode increases.

In the electrode pad on the conductive semiconductor substrate, a rate of change in the taper width of portion having a taper shape in the wiring electrode and/or an angle of inclination of the inclined side wall surface may be adjusted so that the characteristic impedances of the electrode pad and the wiring electrode are substantially 50 ohms.

In the electrode pad on the conductive semiconductor substrate, the width of the wiring electrode formed on the second region and the second thickness maybe adjusted so that the characteristic impedance of the wiring electrode formed on the second region is almost matching with the characteristic impedance of the electrode pad.

In the electrode pad on the conductive semiconductor substrate, the first thickness may be set according to the size of the electrode pad and the characteristic impedance of the external device.

In the electrode pad on the conductive semiconductor substrate, the size of the electrode pad may be 30 µm or greater.

In the electrode pad on the conductive semiconductor substrate, the characteristic impedance of the electrode pad may be substantially 40 ohms.

In the electrode pad on the conductive semiconductor substrate, the characteristic impedance of the electrode pad may be substantially 50 ohms.

In the electrode pad on the conductive semiconductor substrate, the wiring electrode may be connected to an optical device element, or may be connected to an electronic device element.

In the electrode pad on the conductive semiconductor substrate, the electrode pad may be formed on the end of the conductive substrate.

According to the present invention, the capacitance of the electrode pad portion fabricated on the conductive semiconductor substrate can be reduced, and the characteristic impedance can be controlled for a practical electrode pad size.

For example, if an electrode pad having a characteristic impedance of 50 ohms, which is a characteristic impedance of a general electronic device, is constructed, the interval between the electrode pad and the conductive semiconductor substrate is no more than 5 µm and therefore the width of the electrode pad should be about 10 μm in the conventional structure, while by increasing the interval between the electrode pad and the semiconductor substrate (e.g. about 20 μm) as in the present invention, the width of the electrode pad can be increased (e.g. about 50 μm). In this example, the permittivity of the low-permittivity insulating material film is estimated as the value for general polyimide (3.5). In the conventional structure, the width of the electrode pad is no more than 15 μm even if an insulating material film of which the permittivity is as low as 2 is used.

As a result, metal ribbon wire with a width of 50 μm and which are widely used in a high frequency electrical implementation, and metal wire with a diameter of 25 μm can be realized. Further, characteristics specific to an optical device can be derived, and particularly a dramatic improvement in operation of response to a high-speed electrical signal can be expected.

BRIEF DESCRIPTION OF THE DRAWINGS

FIG. 12 is a flow chart showing the method for fabricating the electrode pad on the semiconductor optical device according to the second embodiment;

BEST MODE FOR CARRYING OUT THE INVENTION

Electrode Pad According to First and Second Embodiments

Figure 1:
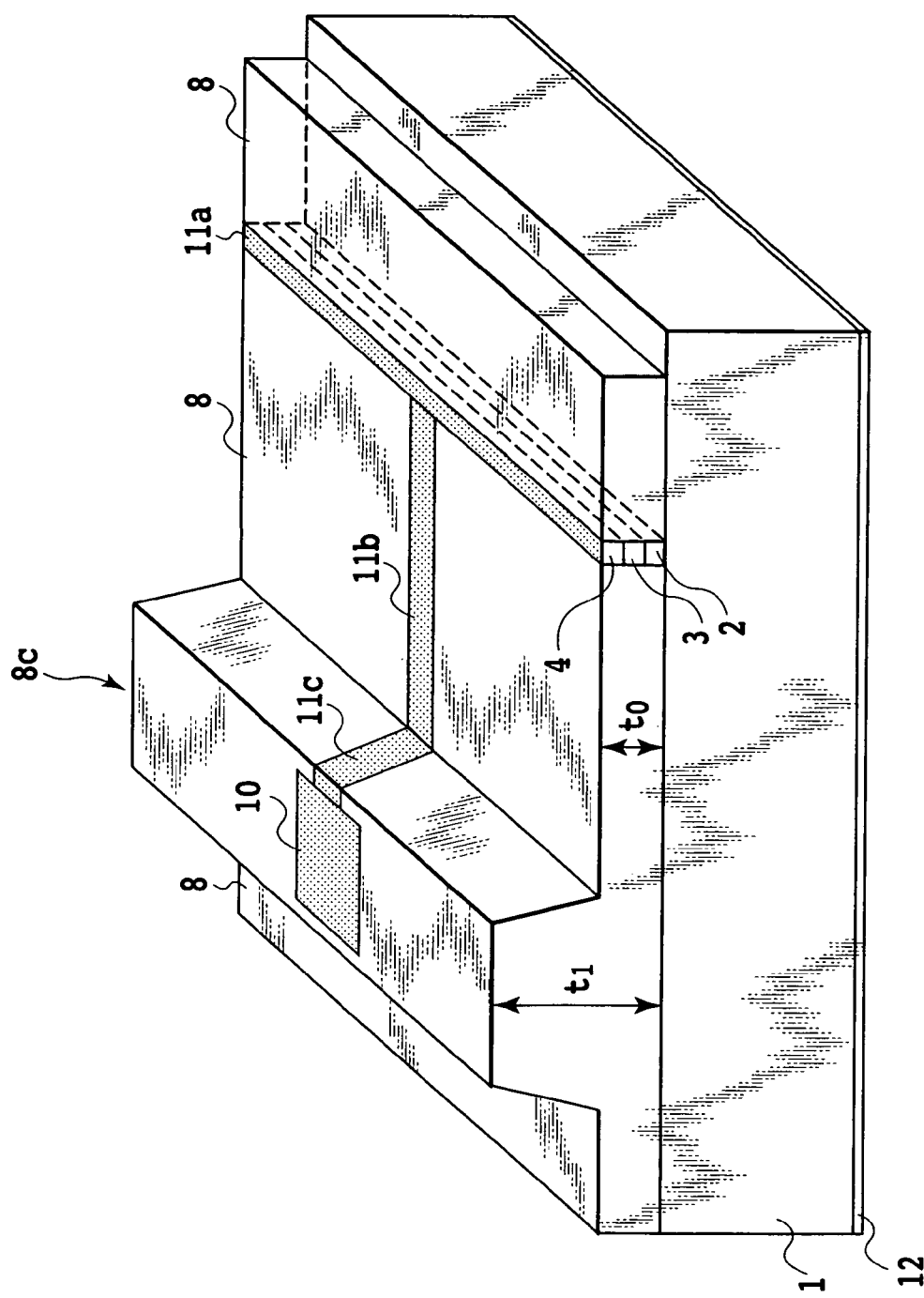
FIG. 1 is a schematic structure diagram (partial perspective view) of an electrode pad on a semiconductor optical device according to a first embodiment.

FIG. 1 is a schematic structure diagram of an electrode pad on a semiconductor optical device according to a first embodiment.

Figure 2:
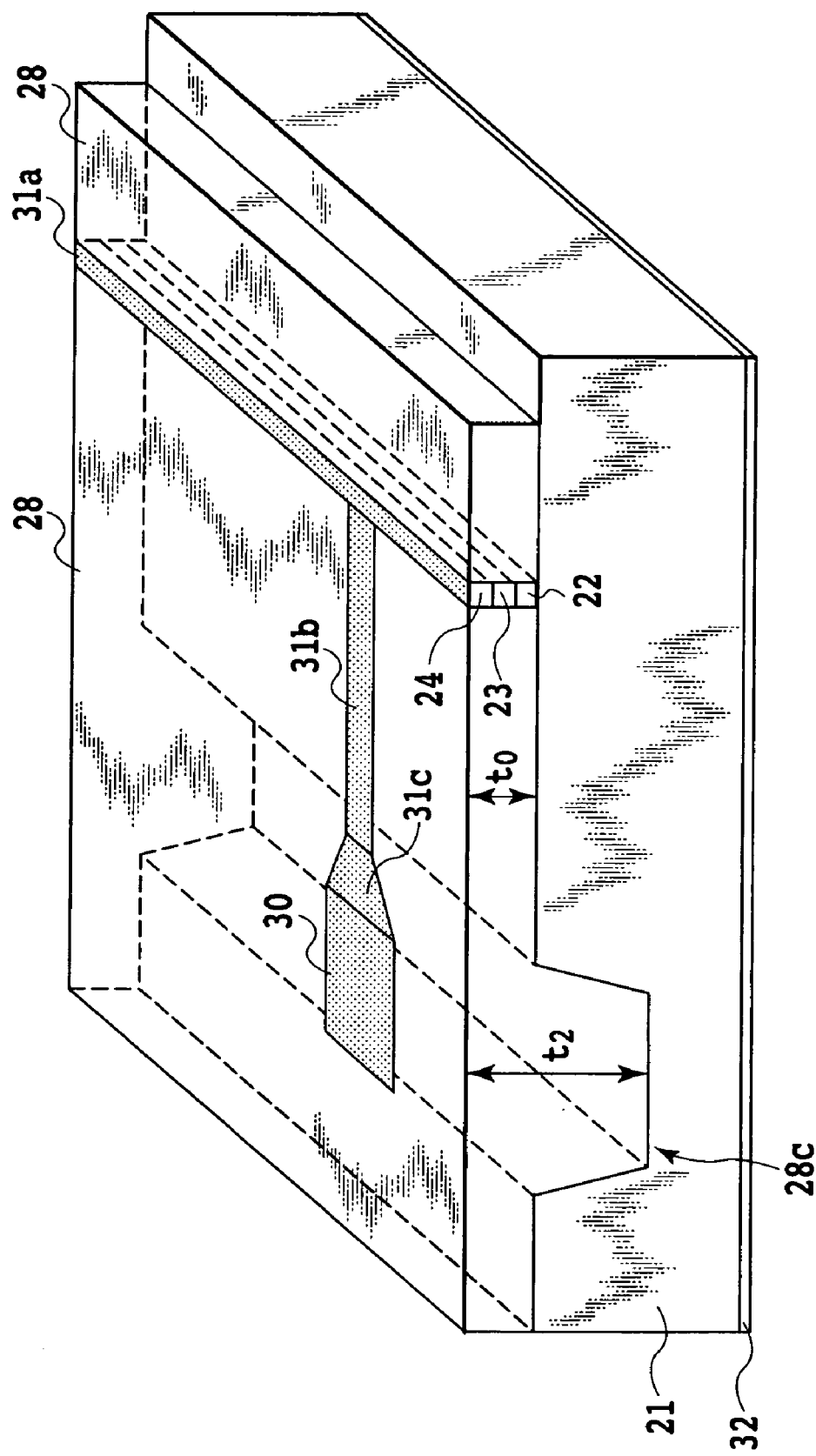
FIG. 2 is a schematic structure diagram (partial perspective view) of the electrode pad on the semiconductor optical device according to a second embodiment.

FIG. 2 is a schematic structure diagram of the electrode pad on the semiconductor optical device according to a second embodiment. These figures show an example of construction of an electrode pad in an optical device fabricated on a conductive semiconductor substrate, but an electronic device or an integrated device of an electrical device and an optical device may be applied instead of the optical device.

As shown in FIG. 1, in the electrode pad on the semiconductor optical device according to the first embodiment, a mesa-stripe type optical waveguide (pin structure: height $t_0$) formed by stacking an n-InP clad layer 2 being a semiconductor clad layer having a first conductivity, an i layer 3 corresponding to an active layer, optical absorption layer or optical waveguide core layer of the optical device, a p-InP clad layer and p type contact layer 4 being a semiconductor clad layer and semiconductor contact layer having a second conductivity is formed on an n-InP substrate 1 being a semiconductor substrate having a first conductivity.

An electrode pad 12 is formed on the undersurface of the n-InP substrate 1, and electrical connection to the optical waveguide from the n-InP clad layer 2 side is established. Electrical connection to the optical waveguide from the p-InP clad layer and p type contact layer 4 is established by an electrode pad 10 provided opposite to the n-InP substrate 1 and wiring electrodes 11b and 11c between the electrode pad 10 and an electrode 11a on the semiconductor layer 4 having a second conductivity.

The electrode pad 10 (and wiring electrodes 11b and 11c) is placed on the n-InP substrate 1 via a low-permittivity insulating material film 8 as an interlayer insulating film for preventing a short circuit with the n-InP substrate 1.

The low-permittivity insulating material film 8 is formed by, for example, a polyimide material, BCB material or the like, reduces a capacitance a rising in the electrode pad 10 portion opposite the n-InP substrate 1 and allows characteristic impedance control of the electrode pad 10 portion.

Namely, the low-permittivity insulating material film 8 is formed into mesa shape at a portion below a region including at least the electrode pad 10 (mesa-shaped deposited portion which is a protruding portion 8c: thickness $t_1$) so that the electrode pad 10 is placed at a predetermined interval $t_1$ between itself and the n-InP substrate 1.

In this way, the region of the insulating material film 8 including at least the electrode pad 10 is formed into a mesa-shaped deposited portion 8c having a thickness of $t_1$ ($t_1 > t_0$), thus making it possible to increase a distance between the electrode pad 10 and the n-InP substrate 1 having the first conductivity. Accordingly, a capacitance between the electrode pad 10 and the n-InP substrate 1 can be reduced, and characteristic impedance control can be easily performed. Further, the above-mentioned capacitance can be reduced, thus making it possible to increase the size of the electrode pad 10. Namely, the degree of freedom of the electrode pad 10 can be increased.

The electrode pad 10 is electrically connected to another element and wiring electrode, and an electrical signal is supplied to the optical waveguide via the electrode 11a and the wiring electrodes 11b and 11c. The electrode metal 11a is an electrode provided directly above the semiconductor layer 4 having the second conductivity, the wiring electrodes 11b and 11c are wiring electrodes connecting the electrode 11a and the electrode pad 10, and the wiring electrode 11c is a wiring electrode provided on the inclined surface of the mesa-shaped deposited portion 8c.

As shown in FIG. 2, in the electrode pad on the semiconductor optical device according to the second embodiment, a mesa-stripe type optical waveguide (pin structure: height $t_0$) formed by stacking an n-InP clad layer 22 being a semiconductor clad layer having a first conductivity, an i layer 23 corresponding to an active layer, optical absorption layer or optical waveguide core layer of the optical device, a p-InP clad layer and p type contact layer 24 being a semiconductor clad layer and semiconductor contact layer having a second conductivity is formed on an n-InP substrate 21 being a semiconductor substrate having a first conductivity.

An electrode pad 32 is formed on the undersurface of the n-InP substrate 21, and electrical connection to the optical waveguide from the n-InP clad layer 22 side is established. Electrical connection to the optical waveguide from the p-InP clad layer and p type contact layer 24 is established by an electrode pad 30 provided opposite to the n-InP substrate 21 and wiring electrodes 31b and 31c between the electrode pad 30 and an electrode 31a on the P type semiconductor layer 24.

The electrode pad 30 (and wiring electrodes 31b and 31c) is placed on the n-InP substrate 21 via a low-permittivity insulating material film 28 as an interlayer insulating film for preventing a short circuit with the n-InP substrate 21.

The low-permittivity insulating material film 28 is formed by, for example, a polyimide material, BCB material or the like, reduces a capacitance arising in the electrode pad 30 portion opposite the n-InP substrate 21 and allows characteristic impedance control of the electrode pad 30 portion.

Namely, a trench portion 28c is formed on the n-InP substrate 21 below a region of the insulating material film 28 including at least the electrode pad 30, the low-permittivity insulating material film 28 is deposited (thickness $t_2$) in such a manner as to embed the trench portion 28c, and the electrode pad 30 is placed at a predetermined interval $t_2$ between itself and the n-InP substrate 21. The trench portion 28c includes a bottom surface and an inclined side wall surface, and the electrode pad 30 is positioned above the bottom surface of the trench portion 28c.

In this way, the trench portion 28c is provided on the n-InP substrate 21 below the region of the insulating material film 28 including at least the electrode pad 30, and the insulating material film 28 is also deposited in the trench portion 28c in a thickness of $t_2$ ($t_2 > t_0$), thus making it possible to increase a distance between the electrode pad 30 and the n-InP substrate 21 having the first conductivity. Accordingly, a capacitance between the electrode pad 30 and the n-InP substrate 21 can be reduced, and characteristic impedance control can be easily performed. Further, since the above-mentioned capacitance can be reduced, the size of the electrode pad 30 can be increased. Namely, the degree of size-freedom of the electrode pad 30 can be increased.

The surface of the insulating material film 28 on which the electrode pad 30 is formed can be flattened, thus making it possible to facilitate an electrode process.

The electrode pad 30 is electrically connected to another outer element by wire, and an electrical signal is supplied to the optical waveguide via the electrode 31a and the wiring electrodes 31b and 31c. The electrode metal 31a is an electrode provided directly above the P type semiconductor layer 24, and the wiring electrodes 31b and 31c are connecting the electrode 31a and the electrode pad 30.

The wiring electrode 31c is placed directly above the inclined side wall surface constituting the trench portion 28c, and has a taper shape in which the width decreases as the distance from the n-InP substrate 21 decreases (i.e. the thickness of the insulating material film 28 existing between the wiring electrode 31c and the n-InP substrate 21 decreases) in accordance with the inclined side wall surface. As a result, smooth connection is provided between the electrode pad 30 and the wiring electrode 31b with a characteristic impedance, and the characteristic impedance is almost constant.

The electrode pads 10 and 30 in the first and second embodiments described above are configured to have a characteristic impedance of 50 ohms. In these embodiments, the characteristic impedance is 50 ohms, which is a characteristic impedance generally possessed by other electronic devices, but it may have a different value. In these embodiments, the parasitic capacitance is kept at a low level, thus making it possible to easily adjust the characteristic impedance to be a high impedance of 40 ohms or greater.

Namely, the capacitance between the electrode pad and the semiconductor substrate having the first conductivity can be reduced by the above-mentioned thicknesses $t_1$ and $t_2$, thus making it possible to achieve a desired electrode pad size and a desired characteristic impedance of the electrode pad. Thus, limitations on wiring from the external device are suppressed. The characteristic impedance can be made almost matching with the external device.

The first and second embodiments described above show a configuration in which the electrode pad is placed only on one side of the optical device (optical waveguide) as electrode pads 10 and 30 provided opposite to the semiconductor substrate having a conductivity, but the electrode pad may be placed on both sides of the optical device. The embodiments show a configuration in which the electrode pad is placed only on the undersurface of the semiconductor substrate as the electrode pad 32 provided to be connected to the semiconductor substrate having a conductivity, but the electrode pad may be placed on the top surface of the semiconductor substrate or may be placed on the undersurface and the top surface.

The first and second embodiments described above show an example in which an n type semiconductor substrate is used as conductive semiconductor substrates 1 and 21, but a p type semiconductor substrate may be used. The embodiments show an example in which the low-permittivity insulating material film is formed by one kind of material as low-permittivity insulating material films 8 and 28, but a plurality of kinds of low-permittivity insulating material films may be combined.

In the first and second embodiments described above, the electrode pads 10 and 30 are formed in an area at a predetermined distance from the end of the semiconductor optical device, but the electrode pads 10 and 30 may be formed at the end of the semiconductor optical device. In this case, the length of a conductor such as a metal wire for use in wiring between the electrode pad of the semiconductor optical device and the external apparatus can be reduced, and thus instability of signal transmission between the electrode pad and the external device can be further alleviated.

In the first and second embodiments described above, the optical device has a lumped-element electrode structure, but it is not limited thereto, and may have a traveling-wave electrode structure optical device.

What is important in the first and second embodiments is to increase a distance between the electrode pad and the semiconductor substrate having the first conductivity. Namely, it is important that the size of the electrode pad is set so that it is satisfactorily connected to a transmission path from the external device, control of the characteristic impedance is made possible by reducing the capacitance of the electrode pad portion having the size, and resultantly the characteristic impedance of the electrode pad is made matching with that of the transmission path. For this purpose, the low-permittivity insulating material film which is an interlayer insulating layer comprises a first region having a thickness ($t_0$) substantially equal to the thickness (height) of the high mesa-stripe type optical waveguide, and a second region which has a thickness ($t_1$, $t_2$) larger than the thickness to and on which at least the electrode pad is formed. Namely, in the first embodiment, the mesa-shaped deposited portion 8c is provided, and in the second embodiment, the trench portion 28c is provided in the n-InP substrate 21, and the insulating material film is also formed in the trench portion 28c, so that the thickness of the second region is larger relative to the thickness of the first region.

The widths of the wiring electrodes and the pads of the first region and the second region different in thickness of the insulating material film are narrow in the wiring electrode portion and wide in the pad portion according to the thickness of each insulating material film so that the wiring electrode and the pad portion each have a desired characteristic impedance. Accordingly, satisfactory matching of characteristic impedances is possible between the pad portion and the wiring electrode portion. The thickness of the insulating material film directly below the wiring electrode is so narrow that a step from the mesa-stripe type optical wave guide can be reduced to avoid an influence on a fine electrode formation process on the optical waveguide, and in the electrode pad, a size suitable for good wiring between the electrode pad and the external device can be ensured.

At this time, the width of the wiring electrode is preferably set so that the wiring electrode has a desired characteristic impedance when the thickness of the insulating material film directly below the wiring electrode is almost equal to the thickness of the mesa-stripe type optical waveguide.

Thus, in the first and second embodiments, not only the thickness of the insulating material film directly below the electrode pad is simply increased, but also the thickness of the insulating material film directly below the electrode structure (electrode pad and wiring electrode) according to the width of the electrode structure is set, and therefore characteristic impedance control for the external device is improved.

In the first and second embodiments, the optical waveguide is used as a connection element of the electrode pad structure, but the connection element is not limited thereto, and may be any element, such as a light receiving element or vertical cavity surface emitting laser (VCSEL), as long as it is an element which can be used in the optical device.

Electrical Characteristic of Electrode Pad According to Embodiments

The electrode pad has a role of establishing electrical connection to an external measuring apparatus, an external circuit and the like. A metal wire or the like is used for electrical connection, and the metal wire or the like is connected to the electrode pad. Here, if a high frequency electrical signal is supplied and transmitted, use of a low-loss, low-resistance and low-inductance metal wire or the like is generally required, and therefore a metal wire or the like having a larger width is more preferable, and for example, a metal ribbon having a width of about 50 μm is often used. Thus, the electrode pad is required to have a width equivalent to that of the metal wire.

It is important that the characteristic impedance of the electrode pad is controlled and made matching with the characteristic impedance of the external measuring apparatus or external circuit for efficiently supplying and transmitting a high frequency electrical signal from outside. The characteristic impedance of the external measuring apparatus or the like is generally 40 ohms or greater, and especially generally 50 ohms, and in this case, it is desirable that the characteristic impedance of the entire electronic device or optical device including the electrode pad should be 50 ohms. Namely, it is important that the characteristic impedance of an electrode pad having a width large enough for the metal ribbon to be connected thereto is 50 ohms.

Figure 3:
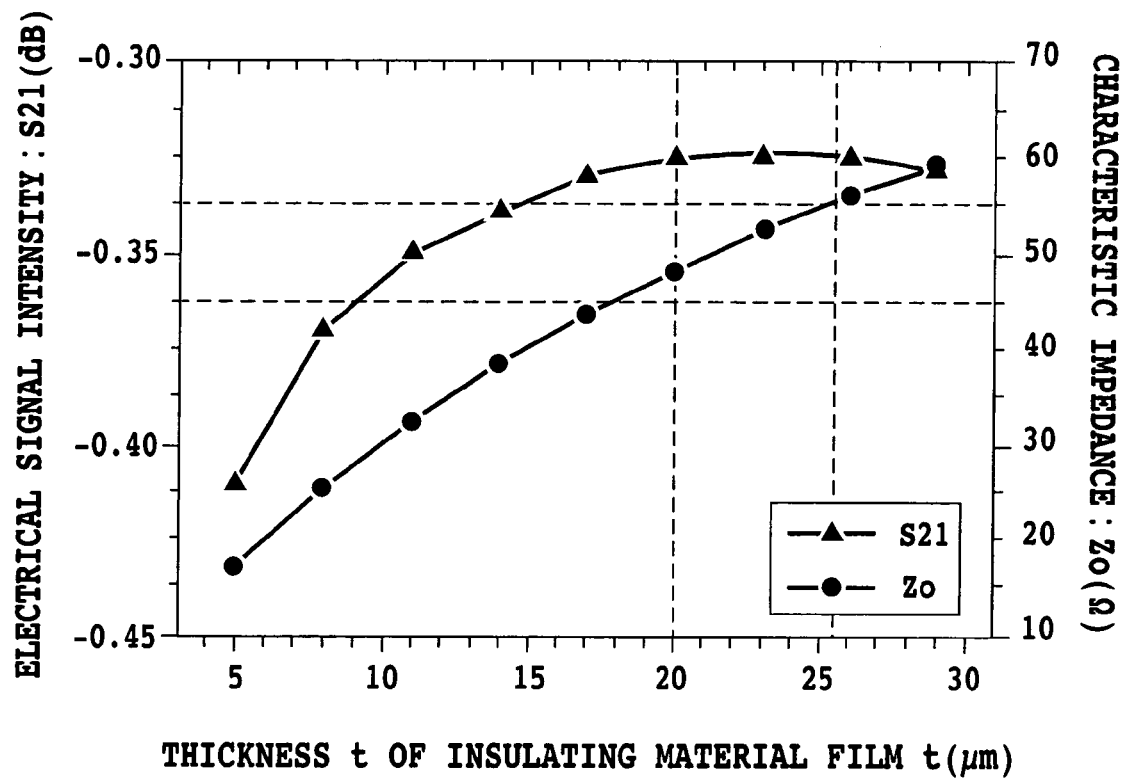
FIG. 3 is a view of a relation between a transmission electrical signal intensity and a characteristic impedance in the electrode pad and the thickness of an insulating material film according to the embodiment.

FIG. 3 is a view of a relation between a transmission electrical signal intensity and a characteristic impedance in the electrode pad and the thickness of the insulating material film according to the embodiment. This figure shows the result of supplying an electrical signal from outer port having a characteristic impedance of 50 ohms at a frequency of 50 GHz, and simulating an electrical signal intensity S21 transmitted to the electrical device or optical device side via the electrode pad having a width of 50 μm, with respect to the thickness ($t_1$ in the first embodiment, and $t_2$ in the second embodiment) of the insulating material film directly below the electrode pad. The characteristic impedance $Z_0$ of the electrode pad portion with respect to the thickness of the insulating material film directly below the electrode pad is also shown.

It is apparent from this figure that when the thickness of the insulating material film directly below the electrode pad is thin, the electrical signal transmission characteristic is poor, and the characteristic impedance at this time is lower than 50 ohms. In addition, it is apparent that the electrical signal transmission characteristic is improved as the thickness of the insulating material film increases, and the transmission characteristic reaches a maximum when the thickness is in the range of 20 μm to 26 μm. It is apparent that the characteristic impedance in the range where the transmission characteristic reaches a maximum is almost 50 ohms (47 to 56 ohms), and is equivalent to the characteristic impedance on the supply side. Further, it is apparent that when the thickness of the insulating material film is increased to a thickness greater than 26 μm, the transmission characteristic is degraded, and the characteristic impedance at this time is shifted to the high impedance side.

The result of simulation shown in this figure is a result obtained on the assumption that the width of the electrode pad is 50 μm, but shows that the insulating material film is required to have a certain degree of thickness for a practical electrode pad width (expected to be connected to a metal wire having a width of 15 μm or greater) as well.

The result of simulation shown in this figure indicates that there is an optimum thickness of the insulating material film for a desired electrode pad width and a desired characteristic impedance. This optimum thickness is generally thicker than the conventional thickness (almost same as the height $t_0$ of the optical waveguide described above). From the result in this figure, the thicknesses $t_1$ and $t_2$ of the insulating material film directly below the electrode pad should be 10 μm or greater, preferably 17 to 29 μm, more preferably 20 to 26 μm.

Practically, the width of the electrode pad is desirably larger than the width of a site of connection to outside, and preferably 30 μm or greater, more preferably 50 μm or greater.

If the width of the electrode pad is too large, interference with an adjacent electrode pad and an increase in scale of the device are induced, and therefore the upper limit of the width of the electrode pad is limited by these requirements. The site of electrical connection to outside is a metal wire or metal ribbon for bonding, or a solder bump or the like in flip chip bonding.

Figure 4:
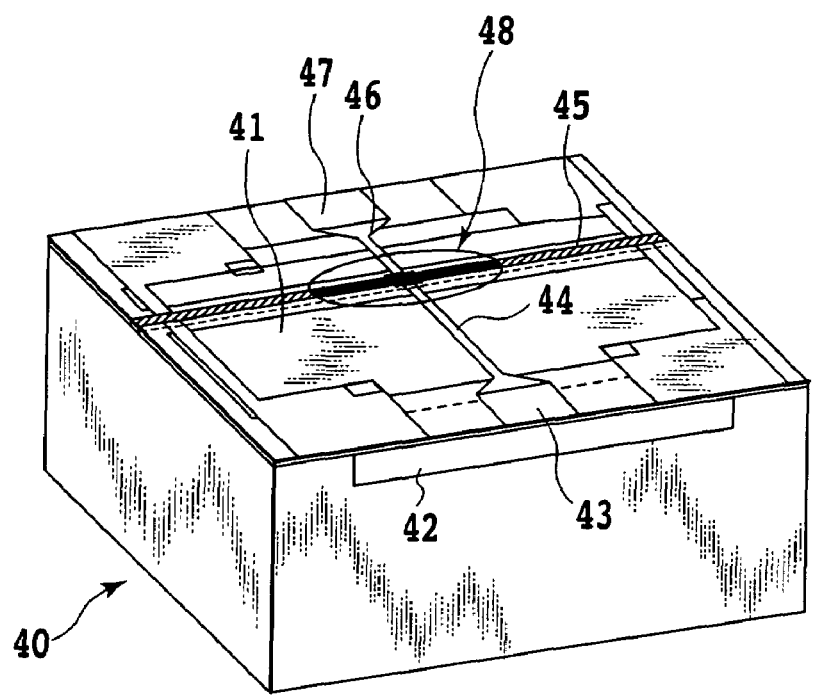
FIG. 4 is a schematic diagram of a semiconductor electroabsorption optical modulator used in analysis according to the embodiment.

FIG. 4 is a schematic diagram of a semiconductor electroabsorption optical modulator used in analysis according to the embodiment.

A semiconductor electroabsorption (EA) optical modulator 48 shown in FIG. 4 is fabricated on a semiconductor substrate (n-InP substrate) 40, employs an input/output electrode structure for the electrode structure, and uses a structure according to one embodiment of the present invention in its electrode pad portion. Namely, an input electrode includes an electrode pad 43 and a wiring electrode 44, and an output electrode includes an electrode pad 47 and a wiring electrode 46. An optical waveguide portion 45 has a structure in which the semiconductor electroabsorption optical modulator 48 having an element length of 75 µm at the center, and to its both ends is connected a passive optical waveguide.

The side surface portion of the optical waveguide portion 45 and an area directly below the electrode/pad are filled with polyimide (insulating material film) 41 having a low permittivity ($\epsilon_r$=2.9). The widths of electrode pads 43 and 47 are 30 µm with consideration given to wire bonding to an external device. A trench portion 42 is formed in a region of the conductive substrate 40 including at least the electrode pad 43, and the polyimide 41 is also embedded in the trench portion 42 as a matter of course. Similarly, the trench portion 42 is formed in a region of the conductive substrate 40 including at least the electrode pad 47, and the polyimide 41 is also embedded in the trench portion 42.

Figure 5B:
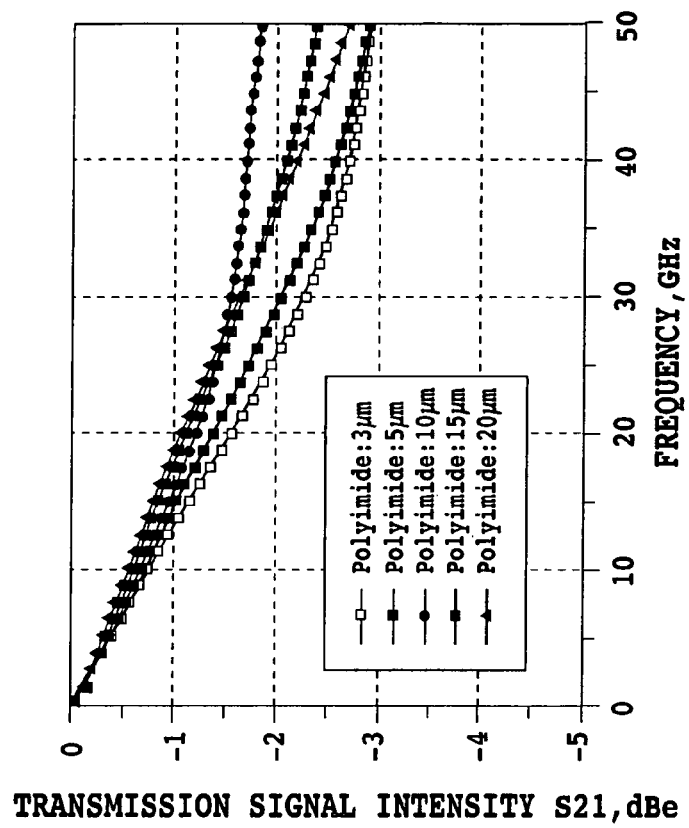
FIG. 5B shows the result of calculation for the dependency of an electrical transmission characteristic on a frequency according to the embodiment.

The results of calculation for the dependency of the electrical reflection characteristic and the electrical transmission on the frequency using as a parameter the depth (thickness of polyimide deposited in the trench portion) of the electrode pad portion of the semiconductor electroabsorption optical modulator in the configuration described above are shown in FIGS. 5A and 5B, respectively.

Figure 5A:
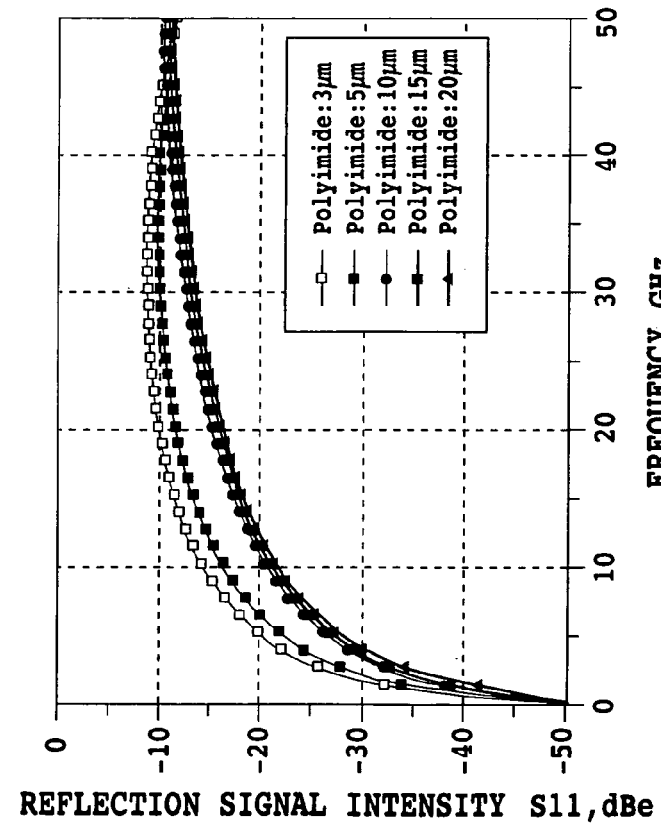
FIG. 5A shows the result of calculation for the dependency of an electrical reflection characteristic on a frequency according to the embodiment.

If a trench 42 is not formed in the area (region including at least the electrode pad 43(47)) directly below the electrode pad portion, namely in the case of the conventional technique in which polyimide having a thickness equivalent to a mesa height of the semiconductor electroabsorption optical modulator exists below the electrode pads 43 and 47, the electrical reflection characteristic is −10 dB or greater at about 18 GHz as apparent from FIG. 5A. A relatively rapid degradation is also found in the electrical transmission characteristic as apparent from FIG. 5B.

In contrast, if a trench portion 42 is formed in the area (region including at least the electrode pad 43(47)) directly below the electrode pad portion, and the thicknesses of polyimide deposited in the trench portion is 5, 10, 15 and 20 µm, the frequency at which the electrical reflection characteristic is −10 dB or greater increases to high frequencies of 27 GHz, 45 GHz, 47 GHz and 47 GHz, respectively, as apparent from FIG. 5A. As apparent from FIG. 5B, a reduction in loss is also found in the electrical transmission characteristic compared with the conventional structure. When the electrical transmission characteristics were compared at 50 GHz, an improvement by about 1 dB was found.

Figure 6:
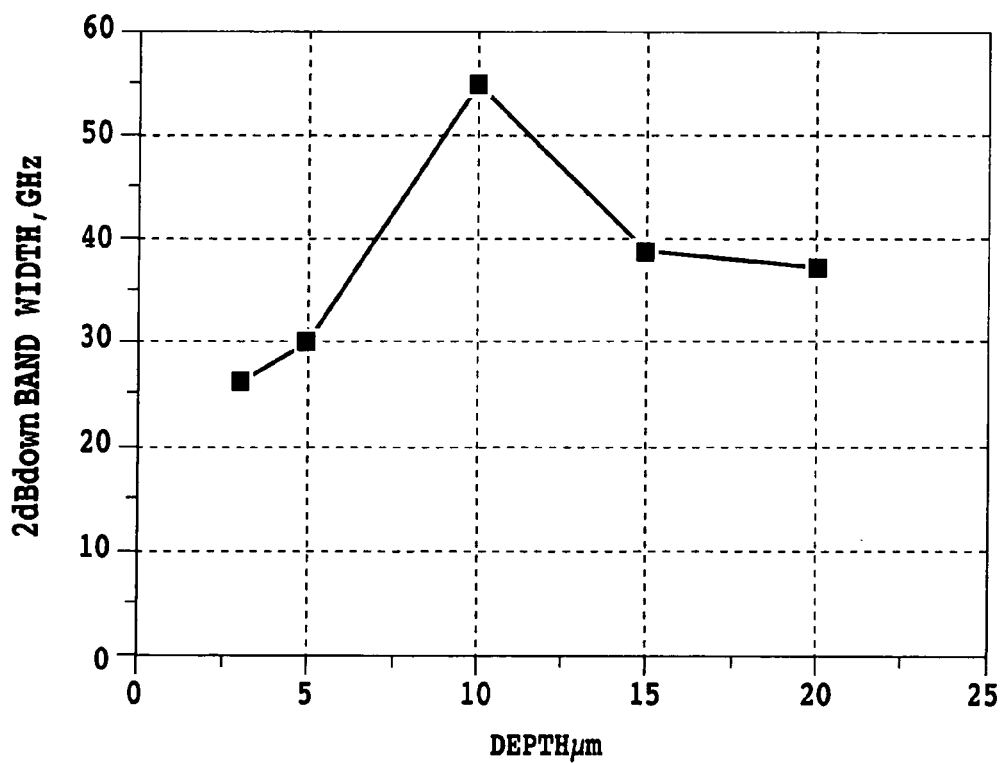
FIG. 6 is a diagram obtained by plotting frequencies at which an electrical transmission loss in the electrode pad is −2 dB according to the embodiment.

FIG. 6 is a diagram obtained by plotting frequencies at which an electrical transmission loss in the electrode pad is −2 dB when the depth of the trench portion directly below the electrode pad portion (electrode width=30 µm) is used as a parameter. Particularly, in a trench depth of 10 µm at which the characteristic impedance is about 50 ohms, the effect is significant, and a good characteristic exceeding 50 GHz can be obtained.

Thus, the thickness of the region including at least electrode pad, of the insulating material film having a low permittivity, is set to a thickness suitable for satisfactory connection to the transmission path from the external device and satisfactory matching of the characteristic impedance.

Method for Fabricating Electrode Pad According to First Embodiment

Figure 7:
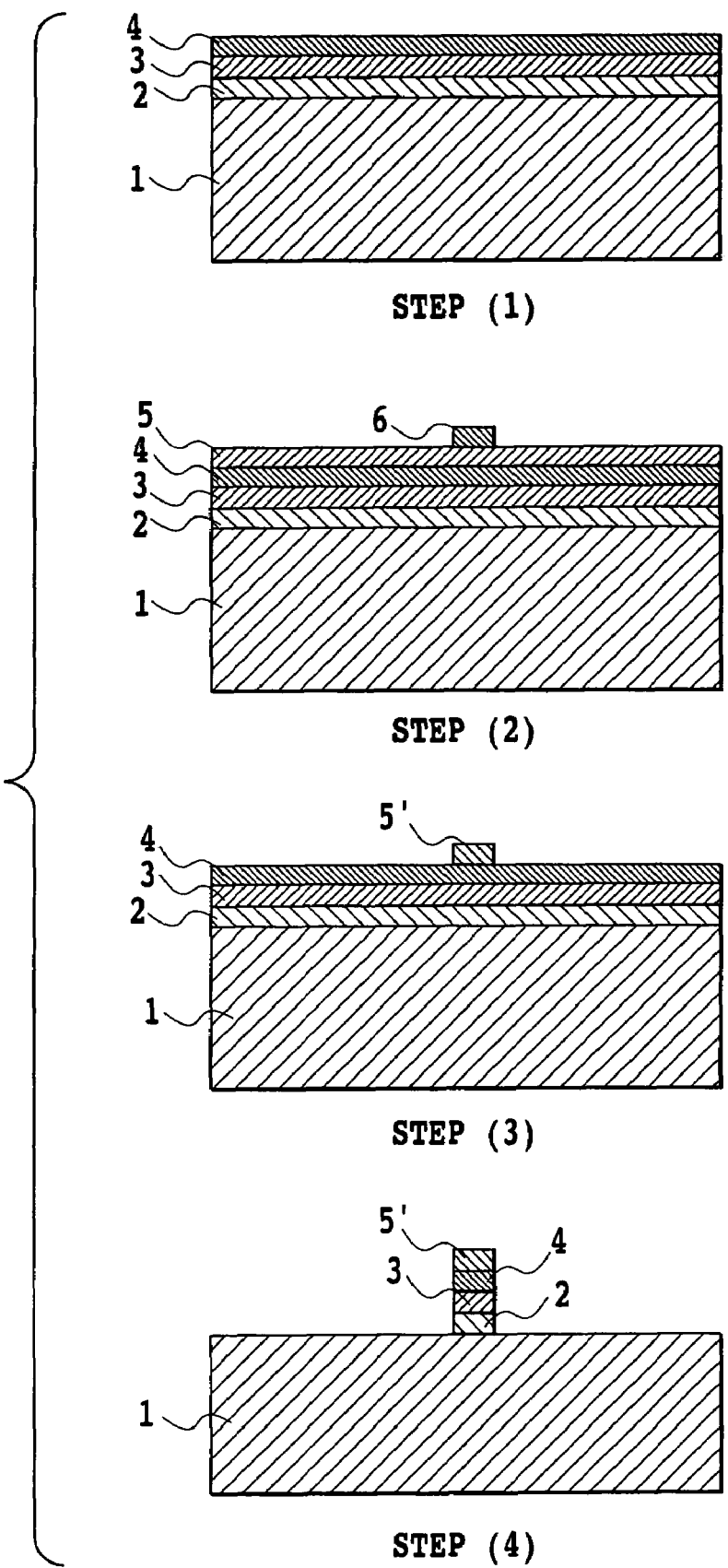
FIG. 7 is a flow chart showing a method for fabricating the electrode pad on the semiconductor optical device according to the first embodiment.
Figure 8:
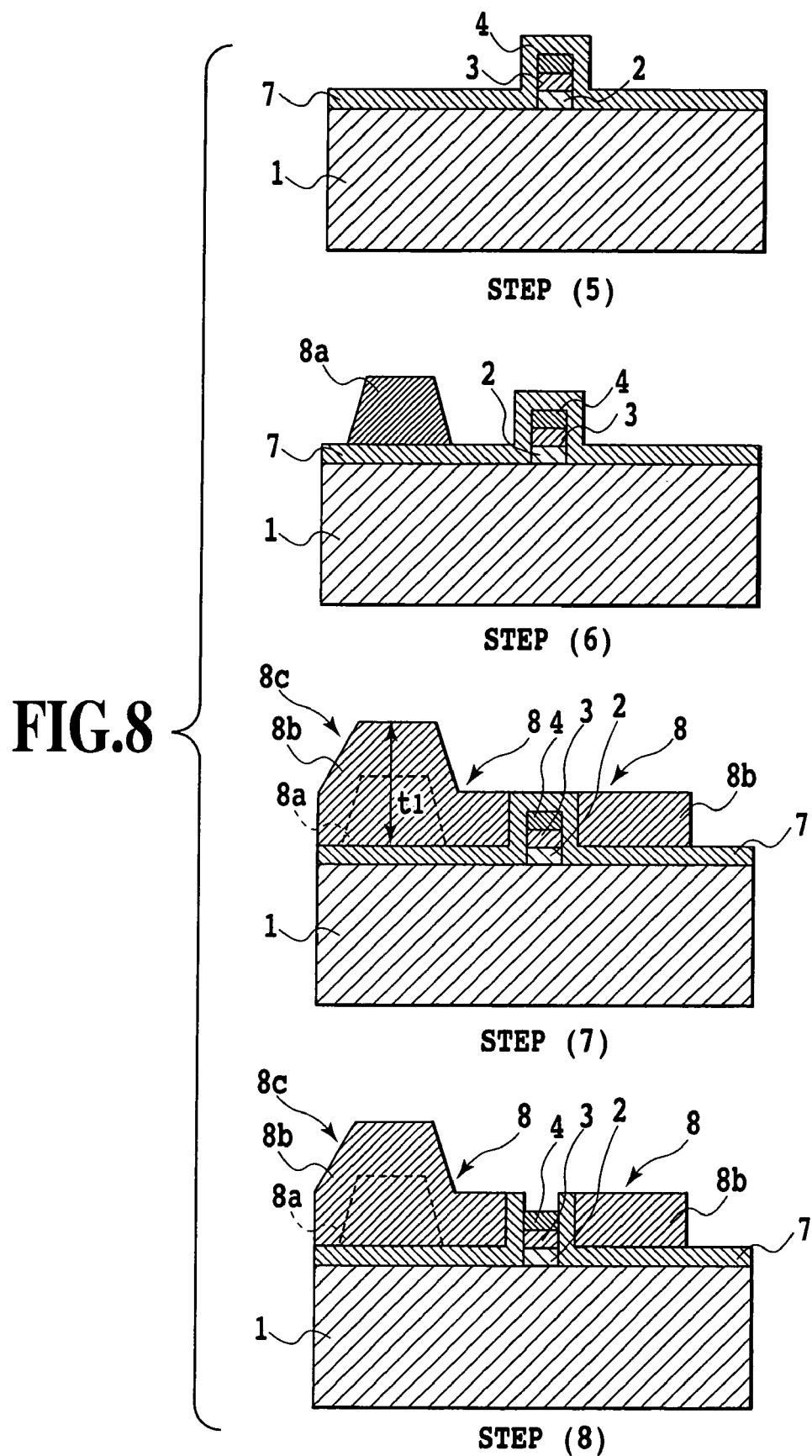
FIG. 8 is a flow chart showing the method for fabricating the electrode pad on the semiconductor optical device according to the first embodiment.
Figure 9:
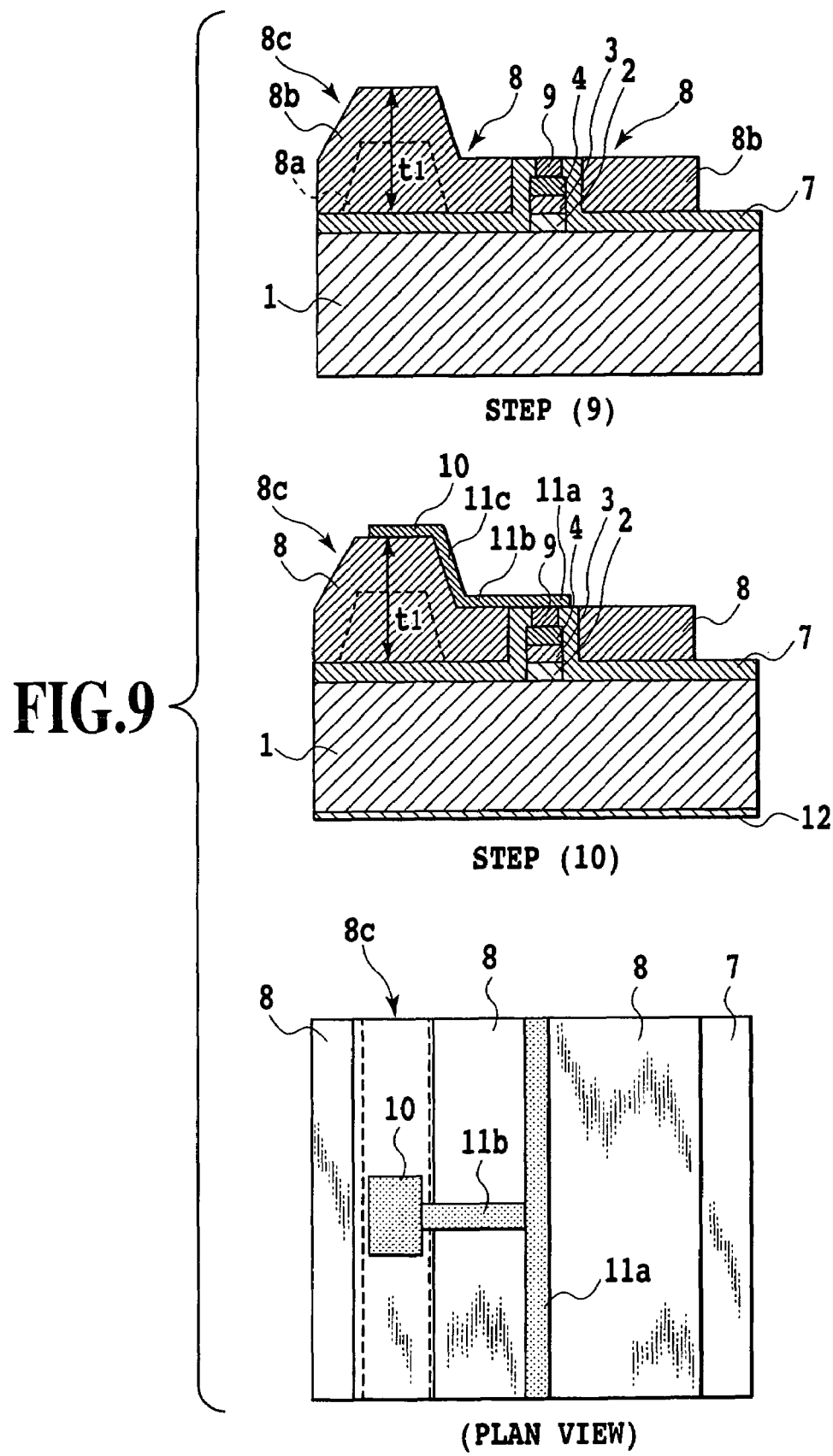
FIG. 9 is a flow chart showing the method for fabricating the electrode pad on the semiconductor optical device according to the first embodiment.

A method for fabricating an electrode pad according to the first embodiment will now be described. FIGS. 7, 8 and 9 are process diagrams showing a method for fabricating an electrode pad on a semiconductor device according to the first embodiment.

First, an n-InP clad layer 2 being a semiconductor clad layer having a first conductivity, an i layer 3 being an active layer, optical absorption layer or optical waveguide core layer of an optical device, and a p-InP clad layer and p type contact layer 4 being a semiconductor clad layer and semiconductor contact layer having a second conductivity are grown one after another on an n-InP substrate 1 being a semiconductor substrate having the first conductivity (FIG. 7, step 1).

On the surface of a wafer on which the semiconductor layers of the optical device were deposited at step 1, a $SiO_2$ film 5 is formed by, for example, a sputtering apparatus, and then a resist 6 is formed using photolithography (FIG. 7, step 2). Then, a $SiO_2$ mask 5' was formed using a dry etching process (FIG. 7, step 3).

A mesa-stripe type optical waveguide is formed by the dry etching process using the $SiO_2$ mask 5' formed at step 3 (FIG. 7, step 4). Generally, the width of a mesa-stripe of a single mode semiconductor laser is no more than 2 µm, and the height of the mesa-stripe is often 5 µm or less.

After the mesa-stripe type optical waveguide was formed, the $SiO_2$ mask 5' is removed by wet etching with HF solution or the like, and a $SiO_2$ film is formed on the entire surface of the wafer as a protective film 7 of the surface of the semiconductor substrate (FIG. 8, step 5).

Then, a first deposited portion 8a in a mesa shape (with trapezoidal cross section) is formed by a low-permittivity insulating material in an area near the mesa-stripe type optical waveguide (FIG. 8, step 6). A location at which the first deposited portion 8a is formed is below a position at which an electrode pad 10 described later is formed. A sufficient interval was provided between the first deposited portion 8a and the optical waveguide so that a contact process in the mesa upper part in the mesa-stripe type optical waveguide can be easily carried out in the subsequent step (FIG. 9, step 10).

As a method for forming the first deposited portion 8a, for example, a low-permittivity insulating material such as a polyimide material or BCB is coated on the protective film 7, a resist mask or the like is then fabricated by photolithography, and portions other than a portion corresponding to an area directly below the electrode pad 10 described later are etched away, whereby the first deposited portion 8a can be formed. As another method, the first deposited portion 8a may be formed by photolithography using a photosensitive polyimide material or the like.

Then, on the protective film 7 and the first deposited portion 8a, a second deposited portion 8b is formed by the low-permittivity insulating material (FIG. 8, step 7). A low-permittivity insulating material film 8 resultantly formed is a film having a mesa-shaped deposited portion 8c with a thickness of $t_1$ near the mesa-stripe type optical waveguide. The insulating material film directly below the wiring electrode 11b being a portion of wiring electrode between the electrode pad portion and the mesa-stripe type optical waveguide is prevented from being thickened in light of ease of fabrication, and was made to have a thickness $t_0$ equivalent to that of the optical waveguide.

Then, the protective film 7 directly above the mesa in the mesa-stripe type optical waveguide is etched away (FIG. 8, step 8). Further, in the area where the protective film 7 had been removed, an ohmic electrode 9 connected to a semiconductor layer 4 having a second conductivity is formed (FIG. 9, step 9).

Then, the electrode pad 10 is formed on the mesa-shaped deposited portion 8c in the low-permittivity insulating material film 8, an electrode 11a is formed on the ohmic electrode 9 of the optical waveguide, wiring electrodes 11b and 11c establishing connection between the electrode pad 10 and the electrode 11a are formed. Further, the n-InP substrate 1 is polished to about 100 μm, and then a back-surface ohmic electrode and an electrode pad 12 are formed on the polished surface (FIG. 9, step 10).

In the first embodiment, the electrode pad was made to have a width of 50 μm so that wire bonding to the electrode pad 10 can be performed, and the low-permittivity insulating material film directly below the electrode pad 10 was made to have a thickness $t_1$ of about 20 μm so that the characteristic impedance in the electrode pad 10 portion was about 50 ohms. The wiring electrode width was adjusted so that the characteristic impedance of the wiring electrode 11b was 50 ohms.

Finally, a plurality of optical device elements formed on the wafer are cut out by cleavage, and the cleaved surface is coated to be rendered unreflective to complete the optical device element. A plan view of the optical device element is shown in FIG. 9.

Method for Fabricating Electrode Pad According to Second Embodiment

Figure 10:
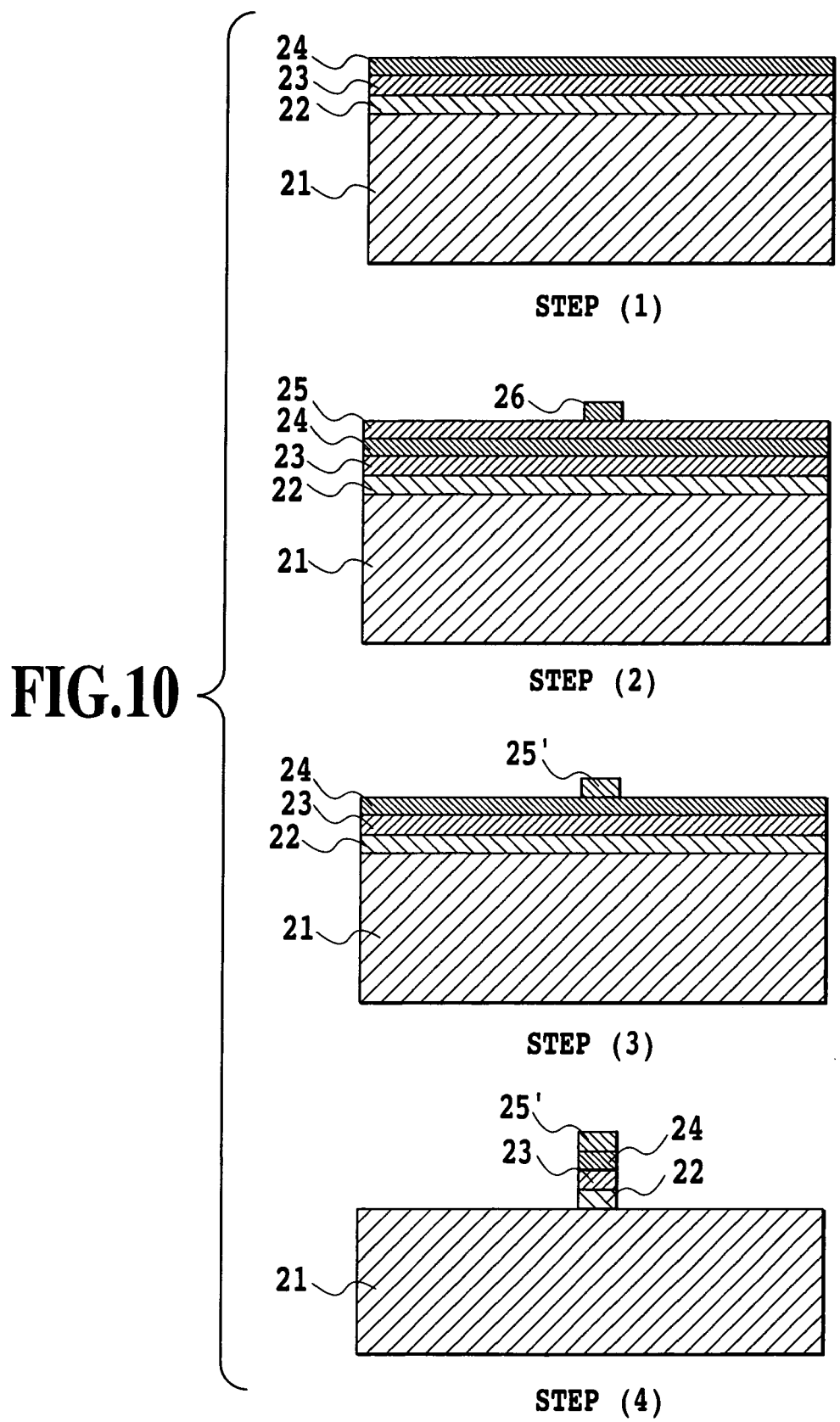
FIG. 10 is a flow chart showing the method for fabricating the electrode pad on the semiconductor optical device according to the second embodiment.
Figure 11:
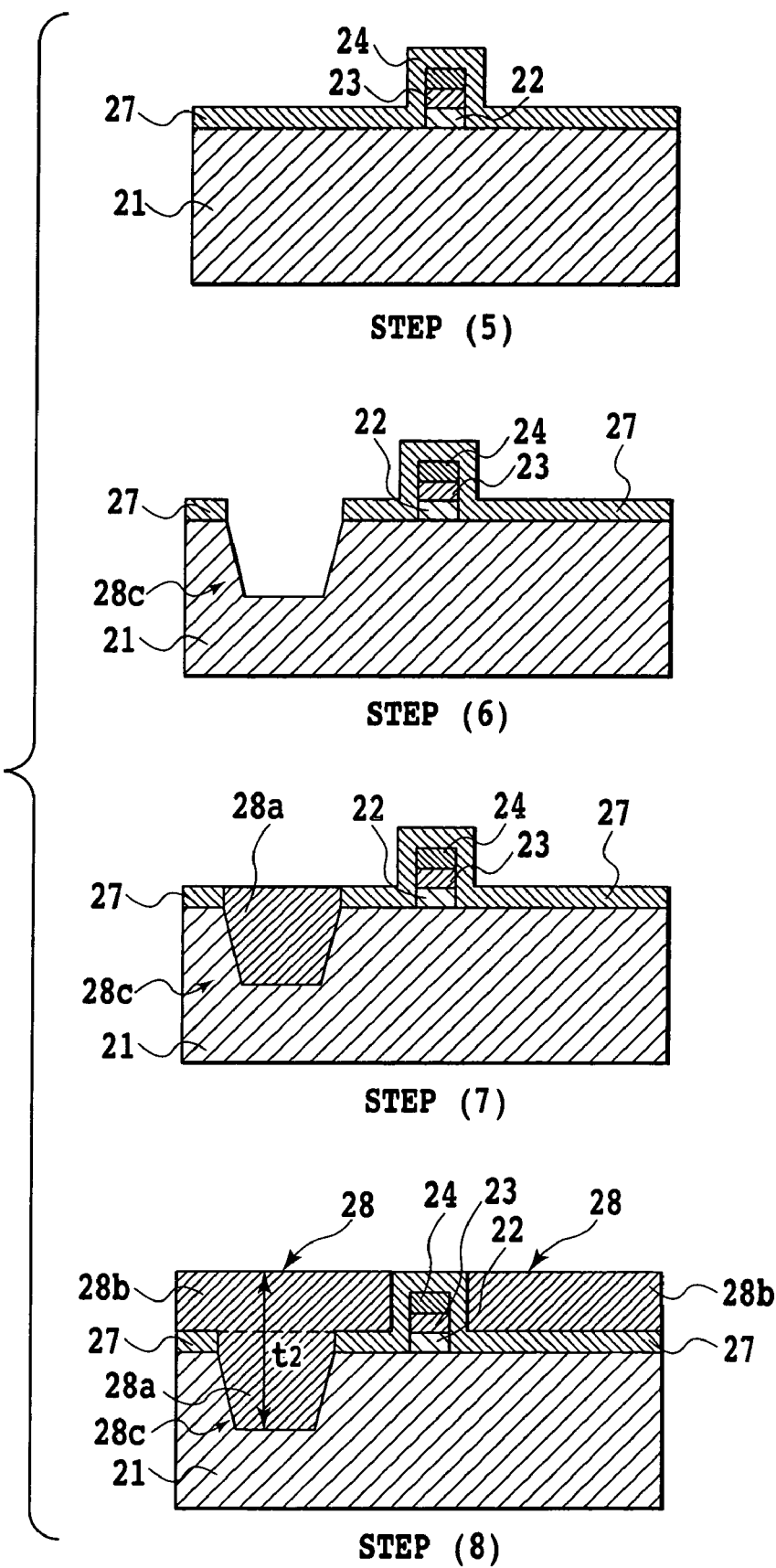
FIG. 11 is a flow chart showing the method for fabricating the electrode pad on the semiconductor optical device according to the second embodiment.
Figure 13A:
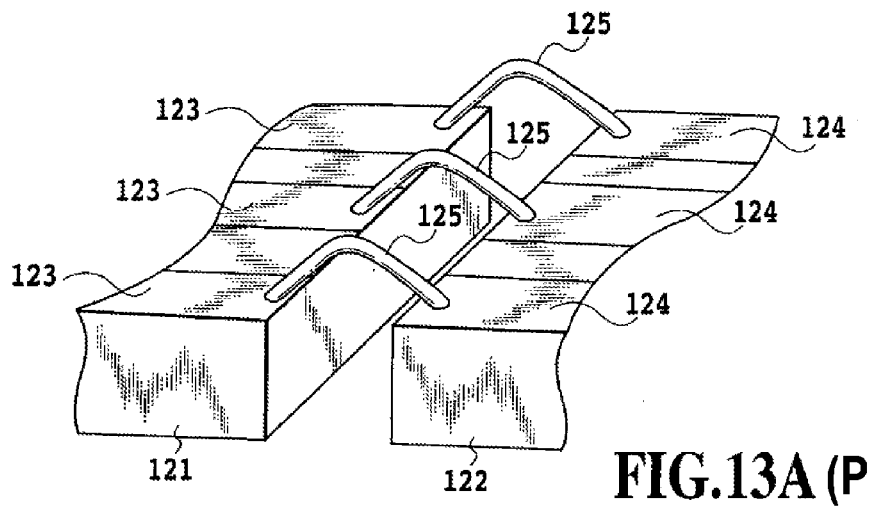
FIG. 13A is a schematic structure diagram of one example of a conventional electrode pad.
Figure 13B:
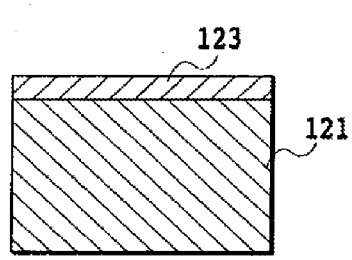
FIG. 13B is a schematic structure diagram of one example of the conventional electrode pad.
Figure 13C:
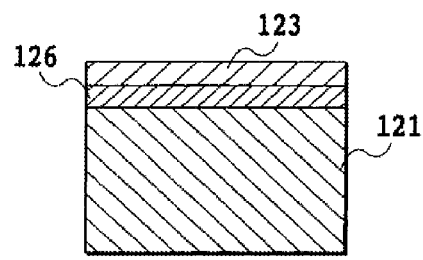
FIG. 13C is a schematic structure diagram of one example of the conventional electrode pad.
Figure 14:
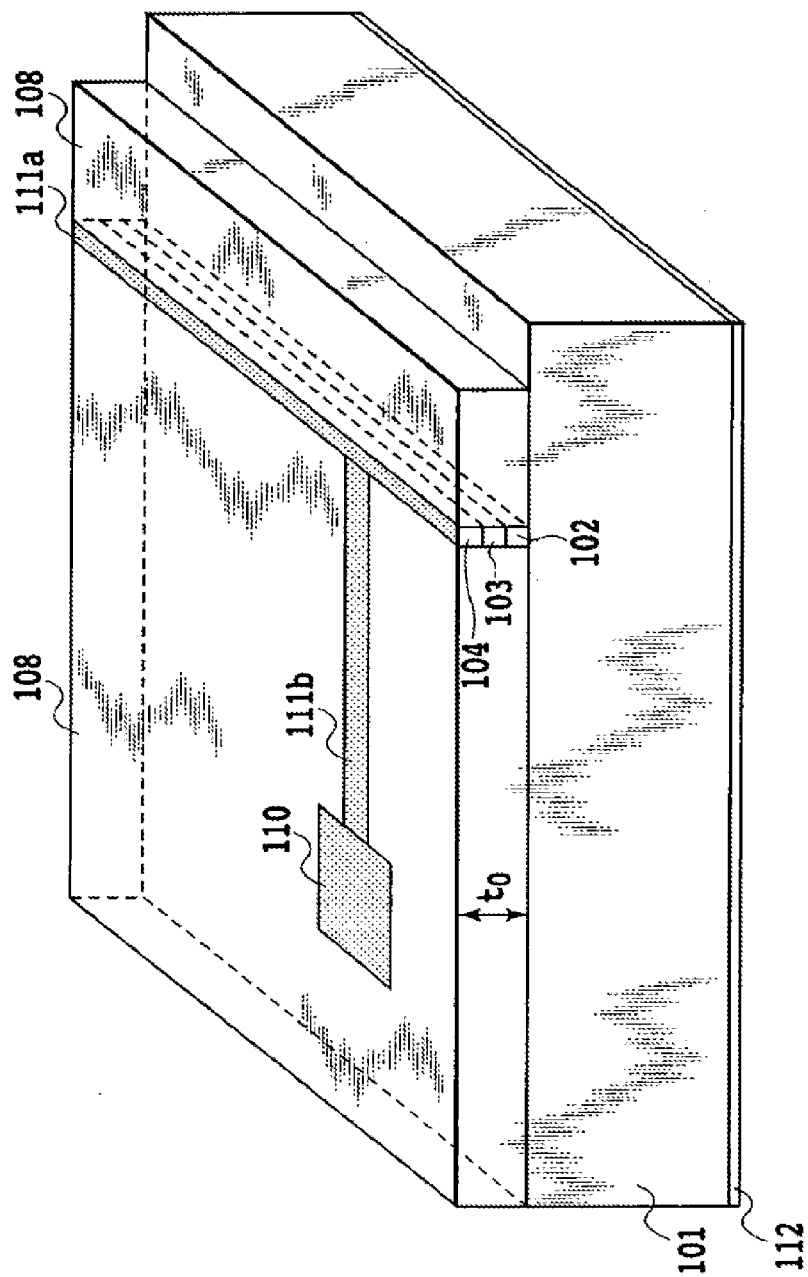
FIG. 14 is a schematic structure diagram (partial perspective view) of the conventional electrode pad on the semiconductor optical device.

A method for fabricating an electrode pad according to the second embodiment will now be described. FIGS. 10, 11 and 12 are process diagrams showing a method for fabricating an electrode pad on a semiconductor optical device according to the second embodiment.

First, an n-InP clad layer 22 being a semiconductor clad layer having a first conductivity, an i layer 23 being an active layer, optical absorption layer or optical waveguide core layer of an optical device, and a p-InP clad layer and p type contact layer 24 being a semiconductor clad layer and semiconductor contact layer having a second conductivity are grown one after another on an n-InP substrate 21 being a semiconductor substrate having the first conductivity (FIG. 10, step 1).

On the surface of a wafer on which the semiconductor layers of the optical device are deposited at step 1, a $SiO_2$ film 25 was formed by, for example, a sputtering apparatus, and then a resist 26 is formed using photolithography (FIG. 10, step 2). Then, a $SiO_2$ mask 25' is formed using a dry etching process (FIG. 10, step 3).

A mesa-stripe type optical waveguide is formed by the dry etching process using the $SiO_2$ mask 25' formed at step 3 (FIG. 10, step 4). Generally, the width of a mesa-stripe of a single mode semiconductor laser is no more than 2 μm, and the height of the mesa-stripe is often 5 μm or less.

After the mesa-stripe type optical waveguide is formed, the $SiO_2$ mask 25' is removed by wet etching with HF solution or the like, and a $SiO_2$ film is formed on the entire surface of the wafer as a protective film 27 of the surface of the semiconductor substrate (FIG. 11, step 5).

Then, part of the protective film 27 near the mesa-stripe type optical waveguide is removed, and wet etching by using HCl based solution is performed using unremoved areas of the protective film 27 as a mask to form a trench portion 28c on the n-InP substrate 21 (FIG. 11, step 6).

A location at which the trench portion 28c is formed is below a position at which an electrode pad 30 described later is formed. A sufficient interval is provided between the trench portion 28c and the optical waveguide so that a contact process in the mesa upper part in the mesa-stripe type optical waveguide can be easily carried out in the subsequent step (FIG. 12, step 10).

The trench portion 28c is made to have a shape in which the side wall surface extending from the surface of the n-InP substrate 21 to the bottom surface of the trench portion 28c is inclined. As a result, a step of coating of a low-permittivity material described later (FIG. 11, step 7) is facilitated. The trench portion 28c may be formed to be vertical.

As a method for forming the trench portion 28c, wet etching with using Br-based solution or the like may be used, or dry etching or the like may be used. For forming the side wall surface of the trench portion 28c into an inclined surface, for example, milling or wet etching may be used.

Then, by photolithography using photosensitive polyimide being a low-permittivity insulating material, the trench portion 28c is back filled, and a first deposited portion 28c is formed in the trench portion 28c (FIG. 11, step 7). As a result, the surface of the n-InP substrate 21 is flattened, thus making it possible to carry out subsequent steps as in the conventional optical device fabricating step.

Then, a second deposited portion 28b is formed on the protective film 27 and the first deposited portion 28a by photolithography using, for example, photosensitive polyimide being a low-permittivity insulating material (FIG. 11, step 8). A low-permittivity insulating material film 28 formed resultantly is a film having a low-permittivity insulating material portion having a thickness of $t_2$ near the mesa-stripe type optical waveguide.

The insulating material film directly below the wiring electrode 31b being a portion of wiring electrode between the electrode pad portion and the mesa-stripe type optical waveguide is prevented from being thickened by forming a trench in the n-InP substrate 21 in light of ease of fabrication, and is made to have a thickness $t_0$ equivalent to that of the optical waveguide. This is also intended for facilitation of a contact process in the mesa upper portion in the mesa-stripe type optical waveguide.

In the step (7) of embedding the insulating material in the trench portion 28c and the step (8) of embedding the insulating material in the periphery of the mesa-stripe optical waveguide, a method in which a non-photosensitive polyimide material, BCB material or the like is coated, and then the insulating material in regions other than necessary regions is removed using a resist mask by a photolithography process and dry etching with $O_2$ gas may be used.

Then, the protective film 27 directly above the mesa in the mesa-stripe type optical waveguide is etched away, an ohmic electrode 29 connected to the semiconductor layer 24 having the second conductivity is formed in an area of the removed protective film 27 (FIG. 12, step 9).

Then, the electrode pad 30 is formed above the trench portion 28c in the low-permittivity insulating material film 28, an electrode 31a is formed on the ohmic electrode 29 of the optical waveguide, and wiring electrodes 31b and 31c establishing connection between the electrode pad 30 and the electrode 31a are formed. Further, the n-InP substrate 21 is polished to about 100 μm, and then a back-surface ohmic electrode and an electrode pad 12 were formed on the polished surface (FIG. 12, step 10).

In the second embodiment, the electrode pad is made to have a width of 50 μm so that wire bonding to the electrode pad 30 can be performed, and the low-permittivity insulating material film directly below the electrode pad 30 is made to have a thickness $t_1$ of about 20 μm so that the characteristic impedance in the electrode pad 30 portion is about 50 ohms. The wiring electrode width is adjusted so that the characteristic impedance of the wiring electrode 31b is about 50 ohms.

The wiring electrode 31c was placed directly above the inclined side wall surface constituting the trench portion 28c, and was made to have a taper shape in which the width decreases as the distance from the n-InP substrate 21 decreases (namely, the thickness of the insulating material film 28 existing between the wiring electrode 31c and the n-InP substrate 21 decreases) in accordance with the inclined side wall surface. As a result, it becomes easy to provide smooth connection between the electrode pad 30 and the wiring electrode 31b with a desired characteristic impedance.

Finally, a plurality of optical device elements formed on the wafer are cut out by cleavage, and the cleaved surface is coated to be rendered unreflective to complete the optical device element. A plan view of the optical device element is shown in FIG. 12.

In the fabrication method according to the second embodiment, the mesa-stripe type optical waveguide is formed on the n-InP substrate 21, and then the trench portion 28c is formed, but the trench portion 28c may be formed first. In the fabrication method, the trench portion 28c is backfilled into flatness with the insulating material so that processes such as photolithography and the like carried out in the subsequent electrode forming step and the like can be easily carried out, but no problem arises in terms of characteristics even if more or less steps are left when the trench portion 28c is backfilled.

In the second embodiment, the trench portion 28c is formed only in an region directly below the electrode pad 30, but a region other than that just below the electrode pad 30 may be trenched as long as the optical waveguide of the optical device can be formed. However, it is easy to have a characteristic impedance of about 50 ohms by reducing the pattern size of the electrode even if the insulating material directly below the electrode pad has a small thickness, i.e. 10 μm or less, in the wiring electrode 31b between the electrode pad and the optical waveguide, compared with the electrode pad portion requiring a certain degree of area, and therefore it is not necessary to provide a trench portion in the semiconductor substrate directly below the wiring electrode 31b.

In the first embodiment, the wiring electrode 11c connecting the electrode pad 10 to the wiring electrode 11b may be made to have a taper shape. The taper shape in which the width decreases as the thickness of the insulating material film directly below the wiring electrode 11c decreases as in the second embodiment allows smooth connection with a characteristic impedance.

In the embodiments described above, an example in which the electrode pad structure according to the present invention is placed in the semiconductor optical device has been described, but it may be applied to an electronic device, or integrated electronic devices and the like such as a terminal resistor and a bias circuit.

The electrode pad structure according to the present invention may be applied to an integrated device having an electronic device and an optical device in combination.

The electrode pad portion and the wiring electrode portion can be made to have a desired value of the characteristic impedance, and the characteristic impedance may be larger or smaller than 50 ohms. In the example explained in the embodiments described above, they have a characteristic impedance of 50 ohms, which is general for other electronic devices, but, for example, an application in which electrical reflection by electrodes near the optical waveguide is eliminated with the characteristic impedance being same as that of the optical waveguide is conceivable.

Electrode pads may be provided between the low-permittivity insulating material film directly below the electrode pad and the semiconductor substrate and between the insulating material film directly below the wiring electrode connecting the electrode pad to the optical waveguide and the semiconductor substrate to establish electrical connection to the conductive semiconductor substrate. In this way, an effect of reducing a loss of an electrical signal from the electrode pad (not an electrode pad opposite to the substrate but an electrode pad electrically connected to the substrate) can be expected.

In this specification, the "optical device element" includes a normal optical device, such as an optical waveguide, light receiving element or semiconductor laser, and having an electrode structure. The "electronic device element" includes an element having an electrode structure in a normal electronic device such as a high output heterojunction bipolar transistor (HBT). Namely, in the present invention, the device element is characterized in its electrode structure, rather than the structure of the element constituting the optical device or electronic device, and therefore can be applied to any element having an electrode structure.

The invention claimed is:

1. An electrode pad on a conductive semiconductor substrate comprising:
    a conductive substrate;
    an insulating material film formed on the conductive substrate;
    an electrode pad formed on the insulating material film; and
    a wiring electrode formed on said insulating material film, connected to said electrode pad, and having a width different from that of said electrode pad,
    wherein the size of said electrode pad is substantially equal to or greater than the size of a part of electrical connection to an external device, and a first thickness of a first region of said insulating material film on which at least said electrode pad is formed is different from a second thickness of a second region of said insulating material film on which at least part of said wiring electrode is formed and which is a region other than said first region so that a characteristic impedance of said electrode pad is almost matching with a characteristic impedance of the external device connected to said electrode pad.

2. The electrode pad on the conductive semiconductor substrate according to claim 1, wherein the width of said wiring electrode is smaller than the size of said electrode pad, and the first thickness of said first region of said insulating material film is grater than the second thickness of said second region of said insulating material film.

3. The electrode pad on the conductive semiconductor substrate according to claim 2, wherein said insulating material film has a protruding portion in which said first region protrudes to the surface side.

4. The electrode pad on the conductive semiconductor substrate according to claim 3, wherein a sidewall surface of said protruding portion is inclined.

5. The electrode pad on the conductive semiconductor substrate according to claim 4, wherein said electrode pad is positioned on the upper surface of said protruding portion, and said wiring electrode placed along the surface of said insulating material film is connected to said electrode pad, and a portion placed on said inclined side wall surface in the placed wiring electrode has a plane taper shape in which the width increases as the thickness up to said semiconductor substrate below the wiring electrode increases.

6. The electrode pad on the conductive semiconductor substrate according to claim 5, wherein a rate of change in the taper width of portion having a taper shape in said wiring electrode and/or an angle of inclination of said inclined side wall surface are adjusted so that the characteristic impedances of said electrode pad and said wiring electrode are substantially 50 ohms.

7. The electrode pad on the conductive semiconductor substrate according to claim 6, wherein the width of the wiring electrode formed on said second region and said second thickness are adjusted so that the characteristic impedance of the wiring electrode formed on said second region is almost consistent with the characteristic impedance of said electrode pad.

8. The electrode pad on the conductive semiconductor substrate according to claim 2, wherein a trench portion is formed on said conductive substrate, and a part of the first region of said insulating material film is formed in said trench portion so that an interval between the bottom surface of said trench portion and said electrode pad equals said first thickness.

9. The electrode pad on the conductive semiconductor substrate according to claim 8, wherein the surface of said insulating material film is substantially flat.

10. The electrode pad on the conductive semiconductor substrate according to claim 9, wherein the side wall surface of said trench portion is inclined to the extent that an angle formed with the bottom surface of the trench portion is greater than the right angle.

11. The electrode pad on the conductive semiconductor substrate according to claim 10, wherein said electrode pad is positioned above the bottom surface of said trench portion, and said wiring electrode placed along the surface of said insulating material film is connected to said electrode pad, and a portion positioned above said inclined side wall surface in the wiring electrode has a plane taper shape in which the width increases as the depth to said semiconductor substrate below said wiring electrode increases.

12. The electrode pad on the conductive semiconductor substrate according to claim 11, wherein a rate of change in the taper width of portion having a taper shape in said wiring electrode and/or an angle of inclination of said inclined side wall surface are adjusted so that the characteristic impedances of said electrode pad and said wiring electrode are substantially 50 ohms.

13. The electrode pad on the conductive semiconductor substrate according to claim 12, wherein the width of the wiring electrode formed on said second region and said second thickness are adjusted so that the characteristic impedance of the wiring electrode formed on said second region is almost matching with the characteristic impedance of said electrode pad.

14. The electrode pad on the conductive semiconductor substrate according to claim 1, wherein said first thickness is set according to the size of said electrode pad and the characteristic impedance of said external device.

15. The electrode pad on the conductive semiconductor substrate according to claim 1, wherein the size of said electrode pad is 30 μm or greater.

16. The electrode pad on the conductive semiconductor substrate according to claim 1, wherein the characteristic impedance of said electrode pad is substantially 40 ohms.

17. The electrode pad on the conductive semiconductor substrate according to claim 1, wherein the characteristic impedance of said electrode pad is substantially 50 ohms.

18. The electrode pad on the conductive semiconductor substrate according to claim 1, wherein said wiring electrode is connected to an optical device element.

19. The electrode pad on the conductive semiconductor substrate according to claim 1, wherein said wiring electrode is connected to an electronic device element.

20. The electrode pad on the conductive semiconductor substrate according to claim 1, wherein said electrode pad is formed on the end of the conductive substrate.

* * * * *